(12) United States Patent
Sasaki

(10) Patent No.: US 6,600,377 B2
(45) Date of Patent: Jul. 29, 2003

(54) GAIN CONTROL AMPLIFIER

(75) Inventor: Makoto Sasaki, Yokosuka (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/187,365

(22) Filed: Jul. 2, 2002

(65) Prior Publication Data

US 2003/0034845 A1 Feb. 20, 2003

(30) Foreign Application Priority Data

Aug. 16, 2001 (JP) ........................................ 2001-246848

(51) Int. Cl.[7] ................................................ H03F 1/22
(52) U.S. Cl. .......................... 330/311; 330/51; 330/285
(58) Field of Search ............................ 330/51, 285, 311, 330/310, 284

(56) References Cited

U.S. PATENT DOCUMENTS 6,046,640 A  *  4/2000  Brunner ...................... 330/254
6,215,355 B1 *  4/2001  Meck et al. .................. 330/51
6,288,609 B1 *  9/2001  Brueske et al. ............. 330/129

* cited by examiner

Primary Examiner—Henry Choe
(74) Attorney, Agent, or Firm—Parkhurst & Wendel, L.L.P.

(57) ABSTRACT

To provide an amplifier in which an amount of variation in output impedance between high- and low-gain modes is small and gain control can be accomplished accurately. A radio frequency signal inputted through an input terminal (1) is provided to a base of a transistor (102) and outputted to its collector. In a high-gain mode, a switch (110) is turned off to place a transistor (104) in an off sate. All radio frequency signals are inputted into an emitter of a transistor (103), outputted to its collector and then to an output terminal (2). In a low-gain mode, the switch (110) is turned on to place the transistor (104) in an on state so that a base voltage of the same value as that of the transistor (103) is applied to it. A current ratio between the transistor (103) and the base-grounded transistor (104) is determined by a size ratio between them. Therefore, a current can be accurately adjusted by adjusting the size ratio between them and outputted to the output terminal (2). Because load conditions of output in the high-gain mode and the low-gain mode are the same, the amount of variation in the output impedance is small.

5 Claims, 8 Drawing Sheets

(a)

(b)

GAIN CONTROL AMPLIFIER

FIELD OF THE INVENTION

The present invention relates to an amplifier a gain of which can be changed.

BACKGROUND OF THE INVENTION

FIGS. 6 and 7 show a prior-art gain control amplifier, respectively.

The gain control amplifier shown in FIG. 6 is configured to amplify a signal inputted from an input terminal 1 by an emitter-grounded transistor 3 and output the signal at an output terminal 2. The amplifier has a high-gain mode in which a power supply voltage is applied to a collector of the transistor 3 from a power supply 10 through a load 9 and a collector-emitter of a base-grounded transistor 4 and a low-gain mode in which the power supply voltage is applied to the collector of the transistor 3 from the power supply 10 through the load 9, a resistance 7, and a collector-emitter of a base grounded transistor 6. Reference number 11 denotes a bias power supply generating a bias voltage that determines an operation point of the transistor 3.

The high-gain mode or low-gain mode is selected by a selector switch 12.

To select the high-gain mode, the selector switch 12 is turned to contact 12a. This causes the bias voltage to be applied only to a base of the transistor 4 out of the bases of the transistors 4 and 6 from a bias power supply 13 and the power supply voltage to be applied to the transistor 3 through the transistor 4. The signal amplified by transistor 3 is outputted from the output terminal 2 through a branch 5.

To select the low-gain mode, the selector switch 12 is turned to a contact 12b. This causes the bias voltage to be applied from the bias power supply 13 only to the base of the transistor 6 and the power supply voltage to be applied to the transistor 3 through the transistor 6. The signal amplified by the transistor 3 is outputted from the output terminal 2 through a branch 8. The gain in the low-gain mode is controlled through the resistance 7.

The gain control amplifier shown in FIG. 7 is different from the one shown in FIG. 6 in that gain control is accomplished by controlling the current ratio between a branch 25 and a branch 27 and current control is accomplished by controlling a base voltage of a base-grounded transistor 6.

In particular, a signal RFin inputted through an input terminal 1 is amplified by an emitter-grounded transistor 3 and outputted at an output terminal 2. Reference number 11 denotes a bias power supply generating a bias voltage that determines an operation point of the transistor 3.

The amplifier has a high-gain mode in which a power supply voltage is applied to a collector of the transistor 3 from a power supply 10 through a load 9 and the collector-emitter of a base-ground transistor 4, and a low-gain mode in which the power supply voltage is applied to the collector of the transistor 3 from the power supply 10 through the collector-emitter of the base-grounded transistor 6.

Base voltage is applied to the bases of the transistors 4 and 6 from power supplies 29 and 30, respectively. Current control is accomplished by changing an output voltage of the power supply 30 to control the base voltage of the base-grounded transistor 6 and the current ratio between the branches 24 and 27 is controlled.

As an example circuit in which a gain control amplifier is used, there can be cited a head amplifier provided at a front end of a radio frequency receiver. As shown in FIG. 8, band-pass filters 709 and 710 are connected in input and output stages, respectively, of a head amplifier A in order to improve selectivity. Reference number 711 denotes a mixer circuit.

Because the band-pass filters 709 and 710 are designed to satisfy an required pass frequency property at predetermined input and output impedances, a gain of the head amplifier A is switched between high-gain and low-gain modes in accordance with electric field strength in an area in which the radio frequency receiver is used.

Therefore, it is required that the predetermined input and output impedances be maintained independently of switching between the high-gain mode and the low-gain mode.

However, in the gain control method in FIG. 6, the output impedance varies depending on the high-gain and low gain modes and therefore it is difficult to achieve output impedance matching in both of the high-gain and low-gain modes.

According to the gain control method shown in FIG. 7, in which the control of the current ratio between the branches 25 and 27 is accomplished by controlling the base voltage of the base-grounded transistor 6, it is difficult to control the gain because the gain changes by 1 dB when the base voltage of the transistor 6 changes by 0.02 volts, for example.

DISCLOSURE OF THE INVENTION

The present invention has been achieved to solve the problems of the prior art and it is an object of the present invention to provide a gain control amplifier in which the amount of variation in output impedance between the high-gain mode and low-gain mode is small and gain control can be performed easily and accurately.

To solve these problems, the gain control amplifier of the present invention has a configuration in which a load is provided in an output circuit of a first transistor, an output circuit of a second transistor is provided between the output circuit of the first transistor and the load, an input signal supplied to the input of the first transistor is amplified, and the amplified signal is taken out from a connection point between the load and the second transistor. In the high-gain mode, only a control bias for the second transistor out of the second transistor and a third transistor is turned on, and in the low-gain mode, control biases for both of the second and third transistors are turned on.

According to the first aspect of the present invention, there is provided a gain control amplifier in which a load is provided in an output circuit of a first transistor, an output circuit of a second transistor is provided between the output circuit of the first transistor and the load, the input signal supplied to the input of the first transistor 1 is amplified, and the amplified signal is taken out from a connecting point between the load and the second transistor, wherein an output circuit of a third transistor is connected in parallel with a series circuit of the output circuit of the second transistor and the load and switch means for turning on and off a control bias for the third transistor is provided, the switching means is turned off to turn on a control bias only for the second transistor out of the second and third transistors in a high-gain mode, and the switch means is turned on to turn on the control bias for both of the second and third transistors in a low-gain mode.

According to this configuration, the amount of variation in the output impedance between the high-gain mode and low-gain mode is small and an output current is determined by the size ratio between the base-grounded transistors, therefore the gain can be controlled easily and accurately without depending on the control bias.

According to the second aspect of the present invention there is provided gain control amplifier in which a load is provided in an output circuit of a first transistor, an output circuit of a second transistor is provided between the output circuit of the first transistor and the load, the input signal supplied to the input of the first transistor is amplified, and the amplified signal is taken out at a connecting point between the load and the second transistor, wherein an output circuit of a third transistor is connected in parallel with a series circuit of the output circuit of the second transistor and the load, control terminals of the second and third transistors are connected with each other through switch means, the switching means is turned off to turn on a control bias only for the second transistor out of the second and third transistors in a high-gain mode, and the switch means is turned on to turn on the control bias for both of the second and third transistors in a low-gain mode.

According to the third aspect of the present invention, in the gain control amplifier according to the second aspect, the switch means is formed with a MOS transistor and a resistance is connected in parallel with a control terminal of the third transistor.

According to the fourth aspect of the present invention, in the gain control amplifier according to any one of the first through third aspects, a resistance is connected in series with the output circuit of the third transistor.

According to the fifth aspect of the present invention, in the gain control amplifier according to any one of the first through fourth aspects, the second transistor and the third transistor are differently sized.

DESCRIPTION OF EMBODIMENTS

Figure 1:
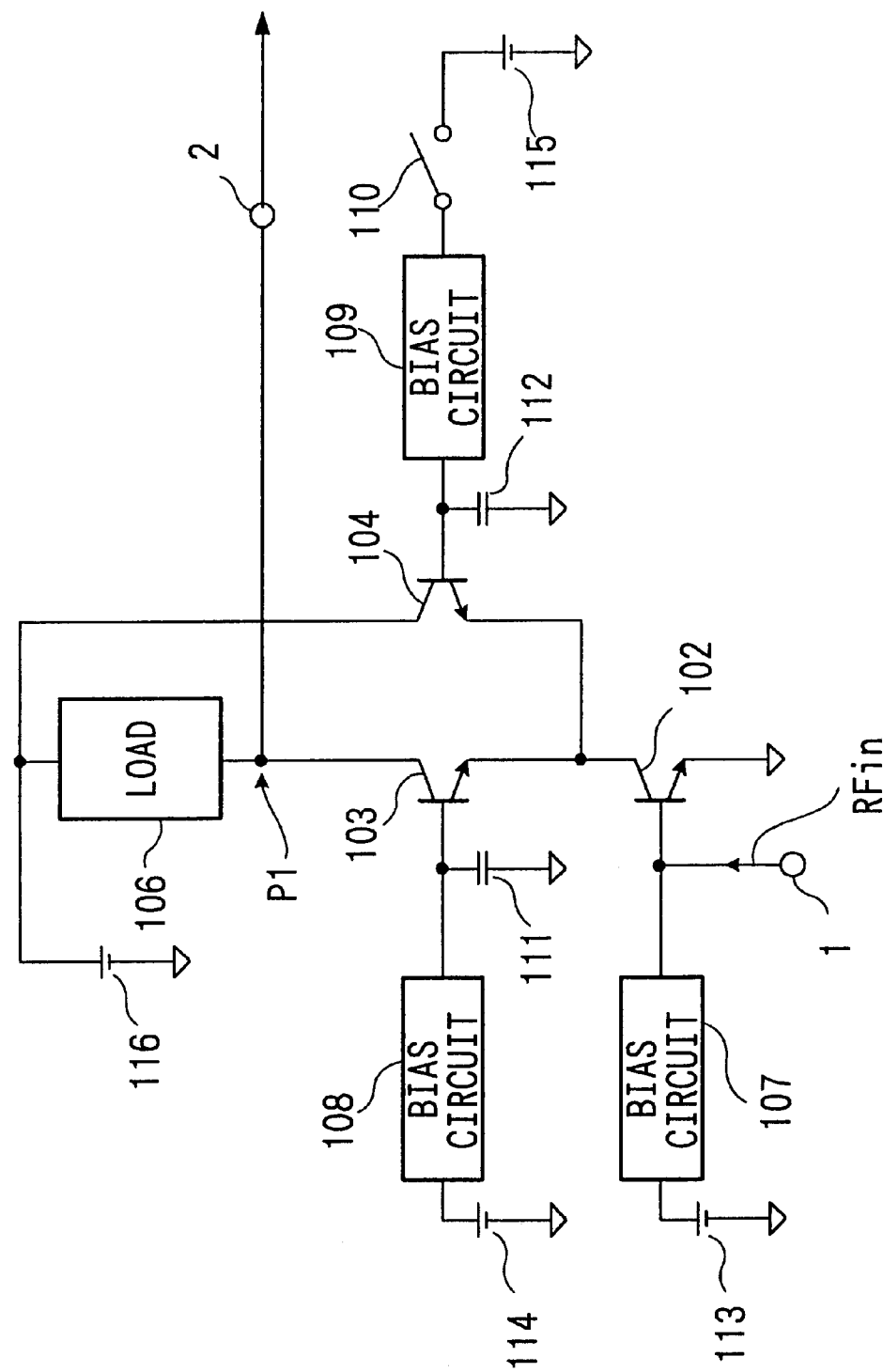
FIG. 1 is a circuit diagram of a gain control amplifier according to a first embodiment of the present invention.

Embodiments of the present invention will be described below with respect to FIGS. 1 through 5.
First Embodiment FIG. 1 shows a gain control amplifier according to a first embodiment of the present invention.

In the gain control amplifier, a load 106 is provided on a collector-emitter side of an output circuit of a first transistor, which is an emitter-grounded transistor 102, and the collector-emitter of the output circuit of a second transistor, which is a base-grounded transistor 103, is provided between a collector of the transistor 102 and the load 106.

An input signal RFin is provided through an input terminal 1 to the base, which is an input of the transistor 102, and amplified. The amplified signal is taken out through an output terminal 2 connected to a connection point P1 between the load 106 and the transistor 103. The collector-emitter of the output circuit of a third transistor, which is a base-grounded transistor 104, is connected in parallel with a series circuit of the collector-emitter of the transistor 103 and the load 106.

Reference number 108 denotes a bias circuit for generating a base bias for the transistor 103 from a power supply 114, reference number 109 denotes a bias circuit for generating a base bias for the transistor 104 from a power supply 115. In the first embodiment, a switch 110 as switch means is provided between and in series with the power supply 115 and the bias circuit 109 so that the base bias to the transistor 104 is turned on and off. Reference numbers 111 and 112 denote radio frequency bypass capacitors. Reference number 107 denotes a bias circuit for generating a base bias for the transistor 102 from a power supply 113.

In the gain control amplifier thus configured, the base bias for the transistor 103 is applied from the bias circuit 108 independently of whether the amplifier is a in high-gain mode or a low-gain mode, whereas the base bias for the transistor 104 is turned on or off by the switch 110 depending on whether it is in the high-gain mode or low-gain mode as will be described below.

In the high-gain mode, the switch 110 is turned off to place the transistor 104 in the off state. In this state, all radio frequency signals are inputted into the emitter of the transistor 103 and outputted to the collector, thus allowing high-gain radio frequency signals to be obtained through the output terminal 2.

In the low-gain mode, the switch 110 is turned on to place the transistor 104 in the on state so that a base voltage of the same value as that for the transistor 103 is applied to it. The current ratio between the transistor 103 and the transistor 104 is determined by the size ratio between the transistor 103 and the second base-grounded transistor 104.

Therefore, a current passing through the transistors can be easily and accurately controlled by adjusting the size ratio between the transistor 103 and the transistor 104 thus allowing a low-gain radio frequency signal to be obtained through the output terminal 2.

For example, the gain can be adjusted by 1 dB by changing a size ratio between the transistor 103 and the transistor 104 from 1:1 to 2:3. In particular, the gain can be decreased by 1 dB by changing the size ratio between the transistor 103 and the transistor 104 from 1:1 to 2:3 and can be increased by 1 dB by changing the size ratio between the transistor 103 and the transistor 104 from 1:1 to 3:2.

Because load conditions of the output are the same in both high-gain and low-gain modes, the amount of variation in the output impedance is small.

According to the first embodiment, an amplifier can be provided in which the amount of variation in impedance between the high-gain mode and the low-gain mode is small and the gain can be controlled easily and accurately.

Figure 2:
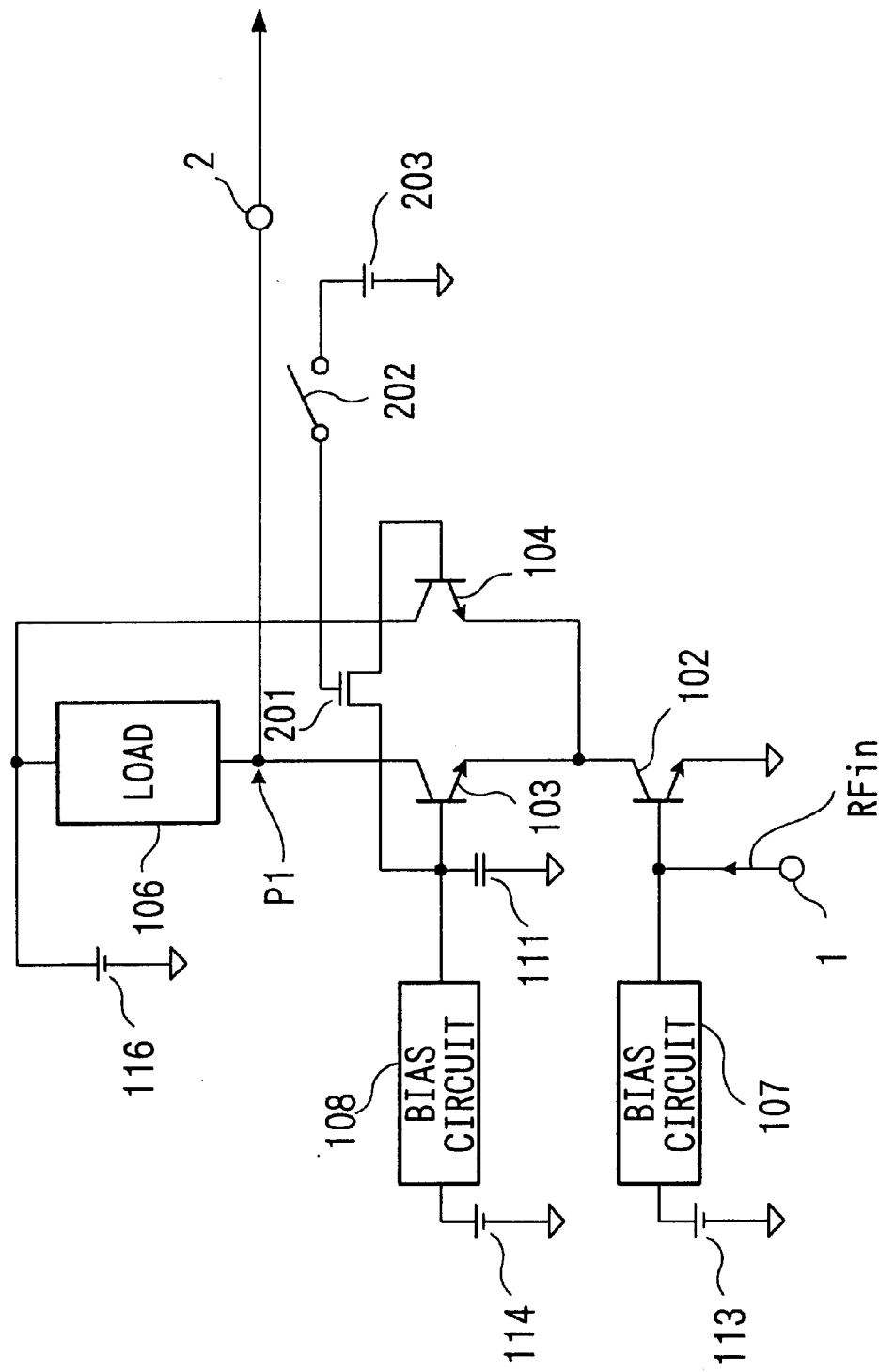
FIG. 2 is a circuit diagram of a gain control amplifier according to a second embodiment of the present invention.

In addition, because the output current is determined by the size ratio between the transistors 103 and 104, the gain can be controlled easily and accurately without depending on a control bias.
Second Embodiment FIG. 2 shows a gain control amplifier according to a second embodiment of the present invention. The second embodiment is the same as the first embodiment, except that the control terminals of transistors 103 and 104 are connected to each other through switch means, which is an output circuit of a MOS transistor 201, and a voltage is applied to a gate of the MOS transistor 201 from a power supply 203 through a switch 202 unlike the first embodiment in FIG. 1 in which the base bias for the transistor 104 is provided from the bias circuit 109.

In particular, a drain of the MOS transistor 201 is connected to the base of the transistor 103 and a source of the MOS transistor 201 is connected to the base of the transistor 104.

In the high-gain mode, the switch 202 is turned off to open the base of the transistor 104 to place the transistor 104 in the off state.

In this state, all radio frequency signals are inputted to the emitter of the transistor 103 and outputted to the collector, thus allowing a high-gain radio frequency signal to be obtained through the output terminal 2.

In the low-gain mode, the switch 202 is turned on to place the transistor 104 into the on state. This allows base bias voltages of the same value to be provided to the bases of the transistors 103 and 104.

At this time, a current ratio between the transistor 103 and the transistor 104 is determined by the size ratio between the transistor 103 and the transistor 104. Therefore, a current passing through the transistors can be controlled easily and accurately and a low-gain radio frequency signal can be obtained through the output terminal 2 by adjusting a size ratio between the transistor 103 and the transistor 104.

Third Embodiment

Figure 3:
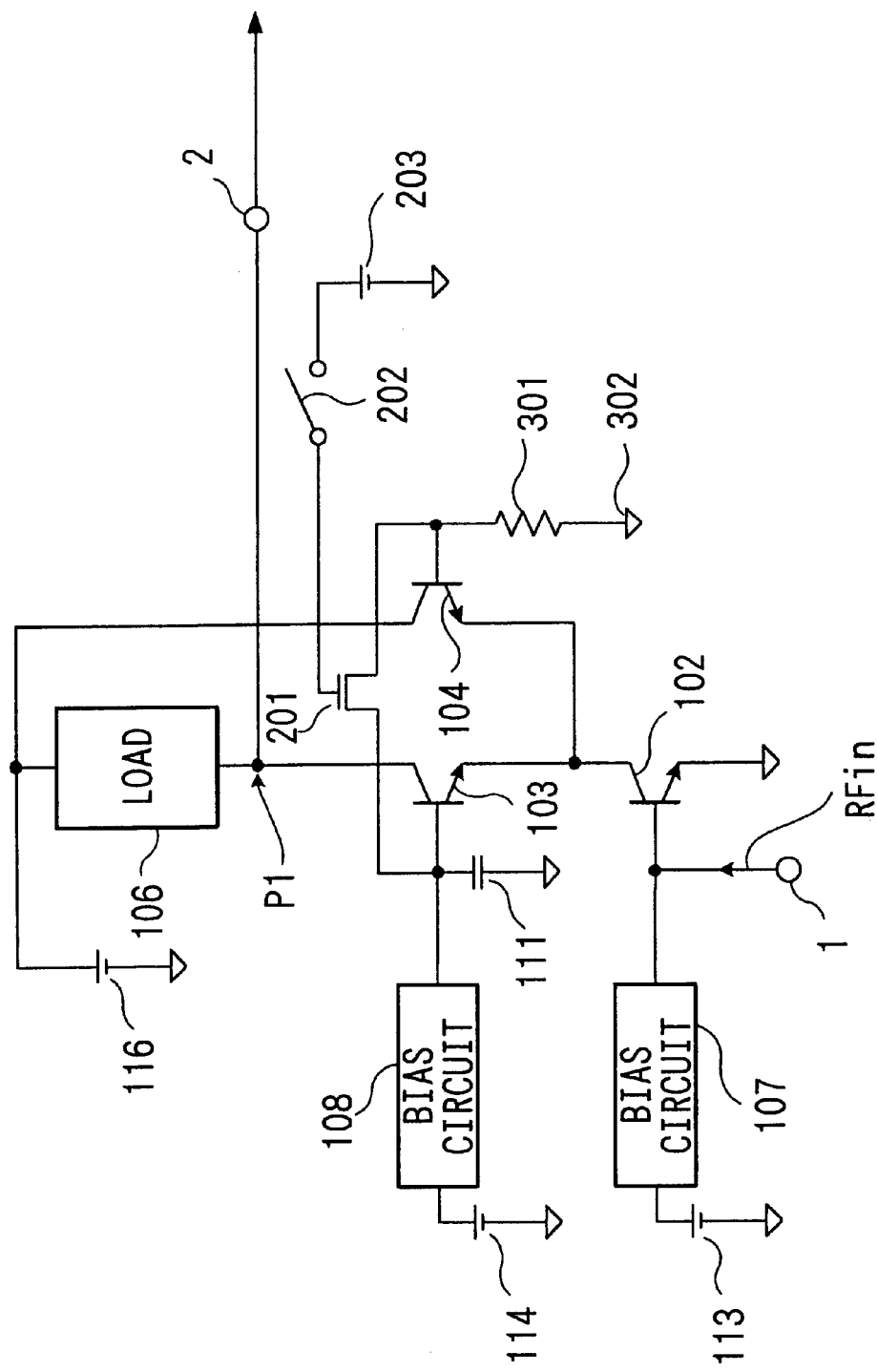
FIG. 3 is a circuit diagram of a gain control amplifier according to a third embodiment of the present invention.

FIG. 3 shows a gain control amplifier according to the third embodiment of the present invention.

The third embodiment is the same as the second embodiment, except that a resistance 301 is connected in parallel with the base of the transistor 104. The resistance 301 is connected between the base of the transistor 104 and a reference potential 302.

In this configuration, the drain of the MOS transistor 201 is connected to the base of a transistor 103 and the source of the MOS transistor 201 is connected to the base of the transistor 104. When the switch 202 is turned off in order to place the amplifier in the high-gain mode, the transistor 104 can be completely turned off because the base of the transistor 104 is grounded through the resistance 301 and, as a result, radio frequency electric power can be attenuated to prevent the radio frequency electric power from traveling to the output terminal.

Fourth Embodiment

Figure 4:
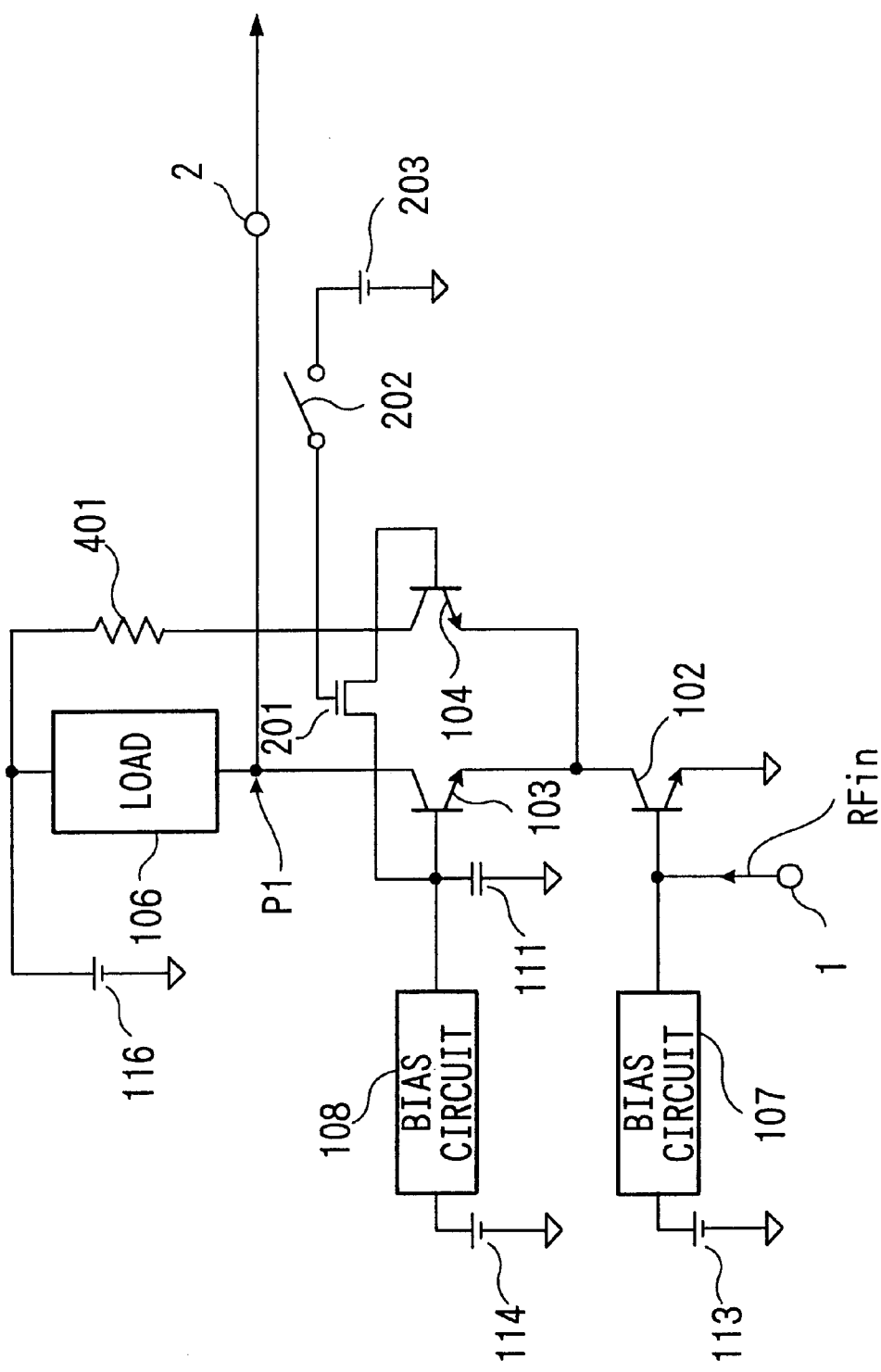
FIG. 4 is a circuit diagram of a gain control amplifier according to a fourth embodiment of the present invention.
Figure 5:
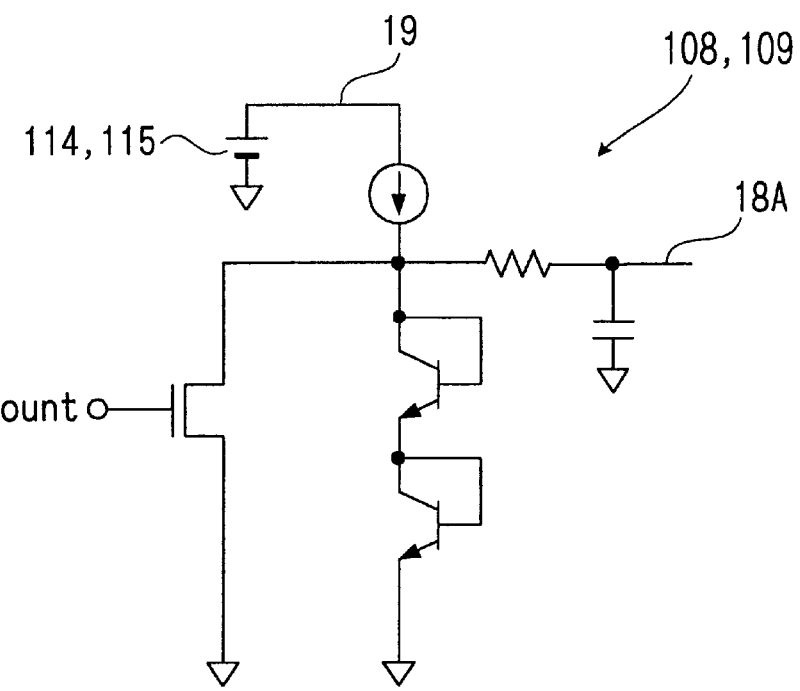
FIGS. 5a and 5b is a schematic diagram of a bias circuit according to each of the embodiments of the present invention.
Figure 5:
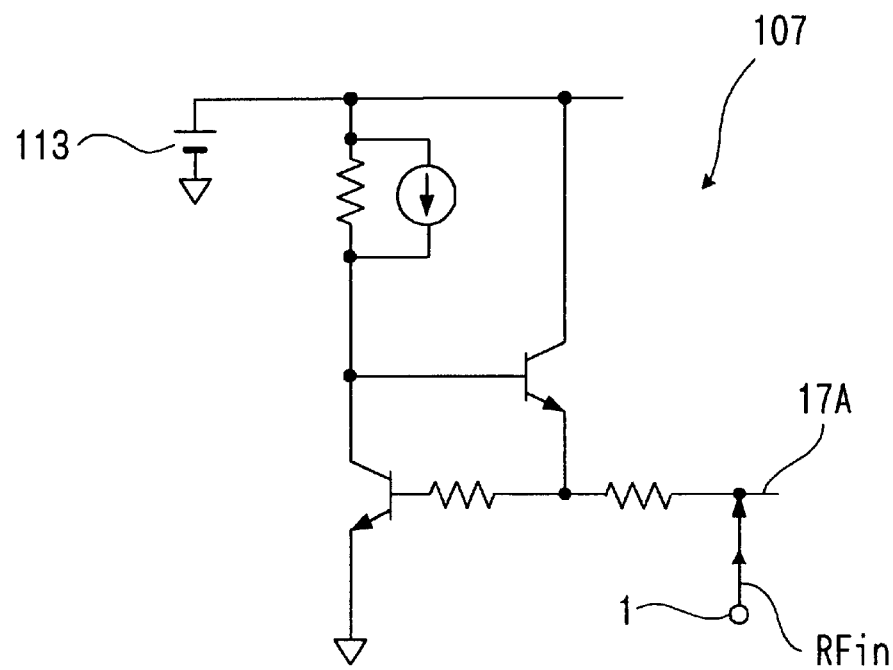
Figure 6:
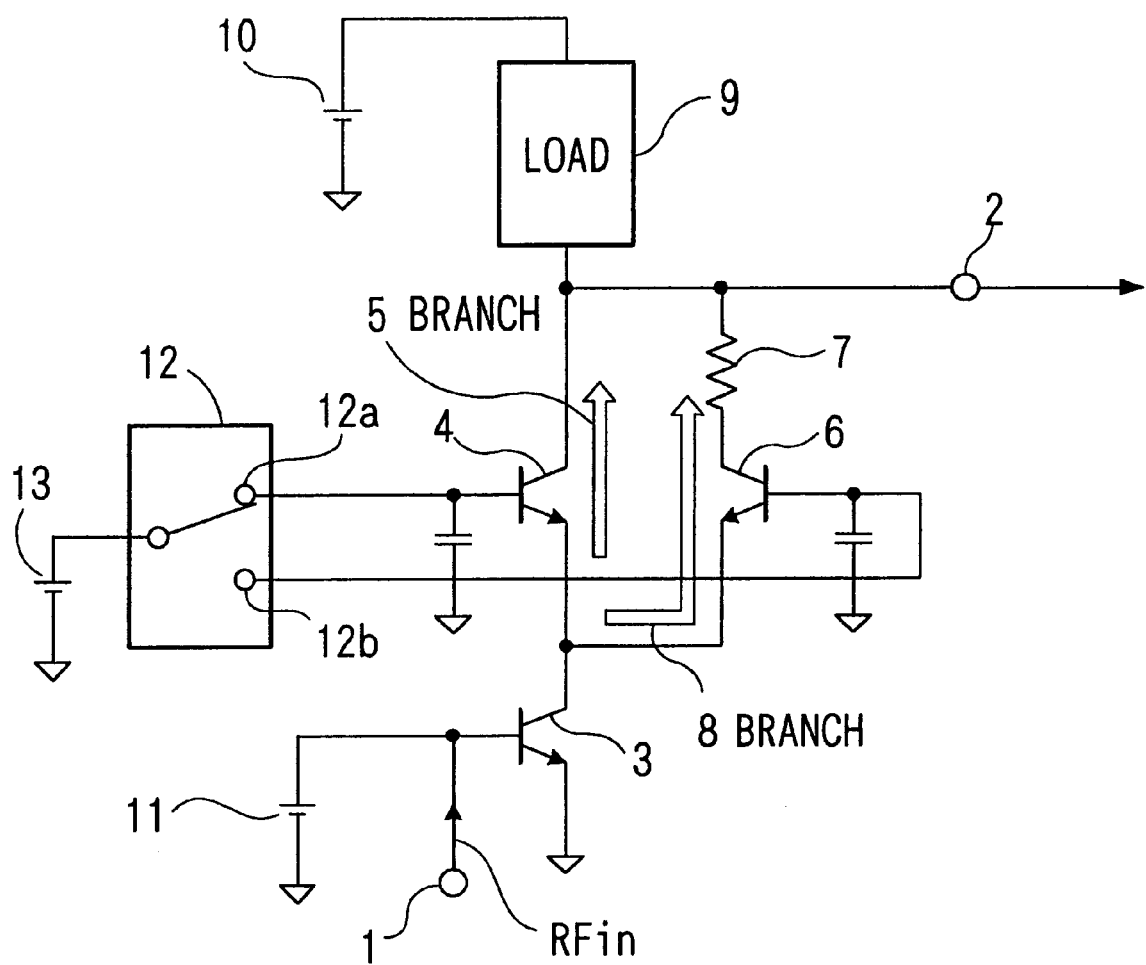
FIG. 6 is a circuit diagram of a first conventional gain control amplifier.
Figure 7:
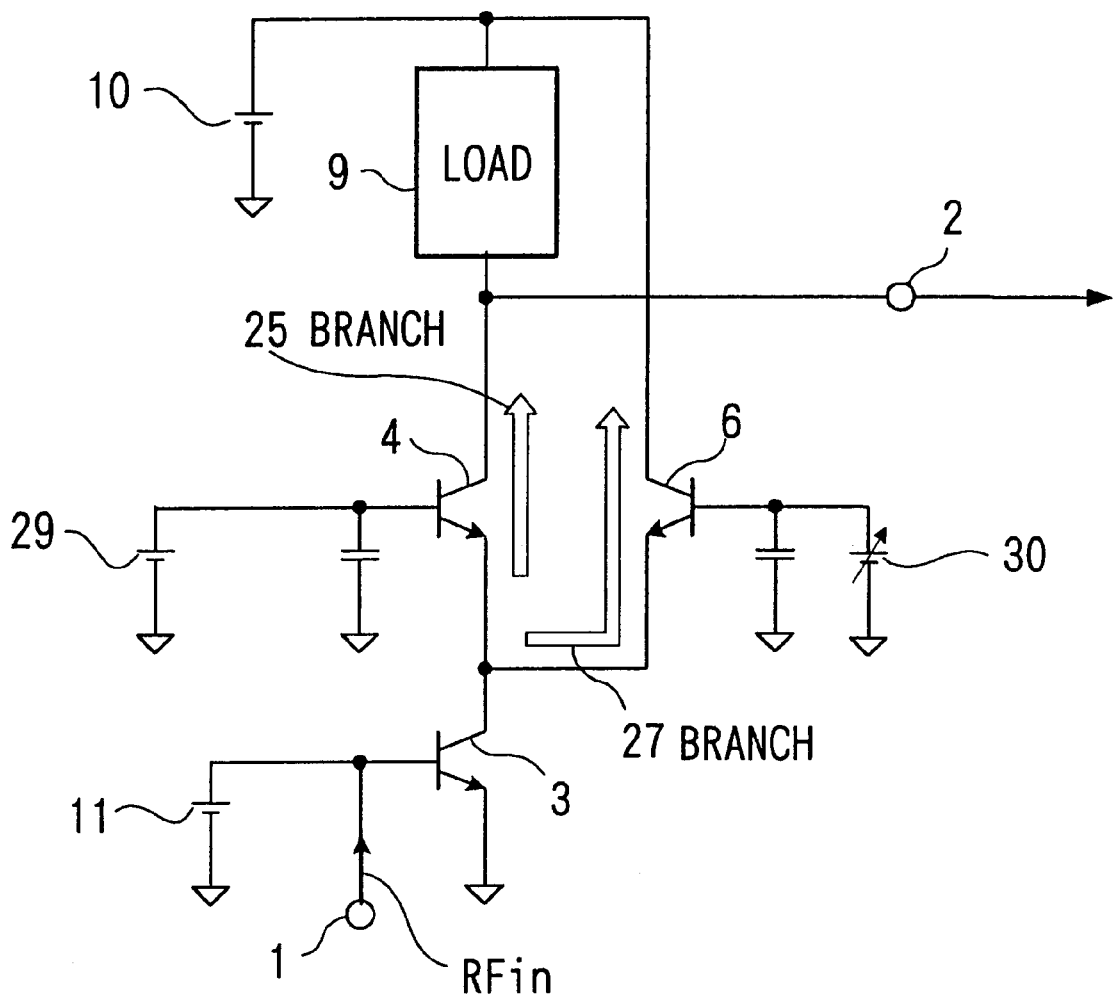
FIG. 7 is a circuit diagram of a second conventional gain control amplifier.
Figure 8:
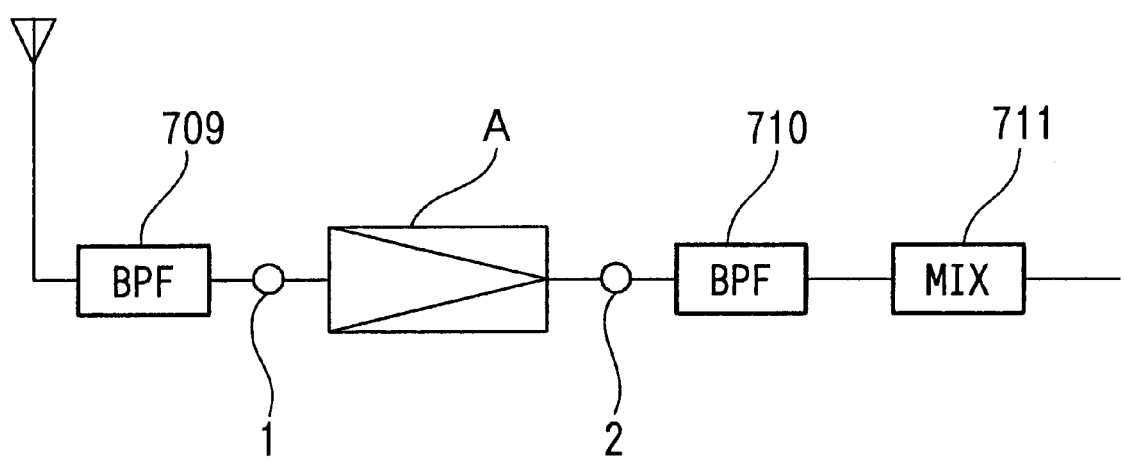
FIG. 8 is a block diagram showing an exemplary application of the gain control amplifier.

FIG. 4 shows a gain control amplifier according to a fourth embodiment of the present invention.

The fourth embodiment is the same as the second embodiment, except that a resistance 401 is provided in series with the collector of the transistor 104.

In this configuration, voltages having the same value can be applied to the bases of the transistor 103 and the transistor 104 by turning on the switch 202 to place the transistor 104 in the on state in the low-gain mode. The resistance 401 connected to the collector of the transistor can attenuate the radio frequency signal to prevent the high frequency radio signal from traveling to the output terminal.

Fifth Embodiment

While in the fourth embodiment the resistance 401 is connected in series with the collector of the transistor 104 of the second embodiment, the resistance can also be connected in series with the collector of the transistor 104 of the first embodiment. Also in this fifth embodiment, the transistor 103 and the transistor 104 may or may not be identically sized.

Sixth Embodiment

In the third embodiment, the resistance 301 is connected in parallel with the base of the transistor 104 of the second embodiment. In the fourth embodiment, the resistance 401 is connected in series with the collector of the transistor 104 of the second embodiment. In the sixth embodiment, the resistance 301 may be connected in series with the base of the transistor 104 of the second embodiment, and the resistance 401 may be connected in series with the collector of the transistor 104. Also in this sixth embodiment, the transistor 103 and the transistor 104 may or may not be identically sized.

The bias circuit 107 in the above-described embodiments is formed with a mirror circuit as shown in FIG. 5b and the bias circuit 108 is configured as shown in FIG. 5a. Reference number 17A denotes a line connecting to the output of the bias circuit 107, 18A denotes a line connecting to the output of the bias circuit 108, reference number 19 denotes a line connecting to the input of the bias circuit 108. The bias circuit 109 has the same configuration as that of the bias circuit 108.

As described above, in the gain control amplifier according to the present invention, the amount of variation in output impedance is small between the high- and low-gain modes and therefore gain control can be accomplished easily and accurately.

What is claimed is:

1. A gain control amplifier comprising:

a first transistor having a first input point and a first output circuit, an a third transistor having a third output circuit;

a load connected to the output circuit of the first transistor;

a second transistor having a second output circuit connected between the first output circuit of said first transistor and said load;

a connecting point located between said load and said second transistor;

said first transistor for amplifying a signal received at said first input point, and for outputting the amplified signal at the connecting point;

a control bias connected to said third transistor;

switch means for turning on and off the control bias; and said third output circuit of the third transistor connected in parallel with a series circuit of the output circuit of said second transistor and said load, wherein:

said switching means is turned off to turn on the control bias only for said second transistor out of said second and third transistors in a high-gain mode, and said switch means is turned on to turn on the control bias for both of said second and third transistors in a low-gain mode.

2. The gain control amplifier according to claim 1, wherein a resistance is connected in series with the output circuit of said third transistor.

3. The gain control amplifier according to claim 1, wherein said second transistor and said third transistor are differently sized.

4. A gain control amplifier comprising:

a first transistor having a first input point and a first output circuit, an a third transistor having a third output circuit;

a load connected to the output circuit of the first transistor;

a second transistor having a second output circuit connected between the first output circuit of said first transistor and said load;

a connecting point located between said load and said second transistor;

said first transistor for amplifying a signal received at said first input point, and for outputting the amplified signal at the connecting point;

switch means or connecting together control terminals of said second and third transistors;

said third output circuit of the third transistor connected in parallel with a series circuit of the second output circuit of said second transistor and said load; and a control bias connected to said switch means, wherein said switching means is turned off to turn on the control bias only for said second transistor out of said second and third transistors in a high-gain mode, and said switch means is turned on to turn on the control bias for both of said second and third transistors in a low-gain mode.

5. The gain control amplifier according to claim 4, wherein said switch means comprises a MOS transistor and a resistance is connected in parallel with a control terminal of said third transistor.

* * * * *